United States Patent [19]

Jeon

[11] Patent Number: 5,768,008
[45] Date of Patent: Jun. 16, 1998

[54] ACTUATOR ARRAY AND METHOD FOR THE MANUFACTURE THEREOF

[75] Inventor: Yong-Bae Jeon, Seoul, Rep. of Korea

[73] Assignee: Daewood Electronics Co., Ltd., Seoul, Rep. of Korea

[21] Appl. No.: 678,893

[22] Filed: Jul. 12, 1996

Related U.S. Application Data

[62] Division of Ser. No. 216,754, Mar. 23, 1994, Pat. No. 5,543,959.

[30] Foreign Application Priority Data

Mar. 23, 1993 [KR] Rep. of Korea ............... 93-45034

[51] Int. Cl.$^6$ .................................................. G02B 26/00
[52] U.S. Cl. ................................................................. 359/291
[58] Field of Search ........................... 359/259, 290, 359/291, 295

[56] References Cited

U.S. PATENT DOCUMENTS 4,932,119  6/1990  Ealey et al. .................. 29/593
5,124,834  6/1992  Cusano et al. ................ 359/291

*Primary Examiner*—Georgia Y. Epps
*Assistant Examiner*—Dawn-Marie Bey
*Attorney, Agent, or Firm*—Anderson Kill & Olick, P.C.

[57] ABSTRACT

An array of M×N electrodisplacive actuators is prepared by:

(1) forming a multilayered ceramic structure having M layers of a first conductive metallization and M+1 layers of an electrodisplacive material;

(2) obtaining a composite ceramic wafer by slicing the multilayered ceramic structure in a direction normal to the layers of the first conductive metallization;

(3) providing a plurality of regularly spaced horizontally directional trenches running parallel to each other wherein each of the trenches is located at an equidistance from two adjacent layers of the first conductive metallization;

(4) depositing a second conductive metallization;

(5) preparing N−1 regularly spaced vertically directional cuts on the composite ceramic wafer prepared using steps (3) and (4) to thereby obtain the array of M×N electrodisplacive actuators.

2 Claims, 5 Drawing Sheets

5,768,008

ACTUATOR ARRAY AND METHOD FOR THE MANUFACTURE THEREOF

This is a divisional application of Ser. No. 08/216,754, filed Mar. 23, 1994, now U.S. Pat. No. 5,543,959.

FIELD OF THE INVENTION

The present invention relates to an optical projection system; and, more particularly, to an actuator array and a novel method for manufacturing same for use in the system.

BACKGROUND OF THE INVENTION

Among the various video display systems available in the art, an optical projection system is known to be capable of providing a high quality display in a large scale. In such an optical projection system, light from a lamp is uniformly illuminated onto, e.g., an array of M×N mirrors. The array of M×N mirrors is mounted on an array of actuators which includes a corresponding number, i.e., M×N, of actuators such that each of the mirrors is coupled with each of the actuators. The actuators are made of an electrodisplacive material such as piezoelectric or electrostrictive material which deforms in response to an electric field applied thereto.

When a reflected light beam from each of the mirrors is incident upon an aperture of a baffle, by applying an electrical signal to each of the actuators, the relative position of each of the mirrors to the incident light beam can be altered, thereby causing a deviation in the optical path of the reflected beam from each of the mirrors. As the optical path of each of the reflected beams is varied, the amount of light reflected from each of the mirrors which passes through the aperture is changed, thereby modulating the intensity of the beam. The modulated beams through the aperture are transmitted onto a projection screen via an appropriate optical device such as a projection lens, to thereby display an image thereon.

Each of the actuators for use in the above-described optical projection system is conventionally made of multiple layers of an electrode and an electrodisplacive material, wherein each layer of the electrode is placed between two layers of the electrodisplacive material, which renders the structure and manufacturing process of such an array of actuators rather complex and costly.

SUMMARY OF THE INVENTION

It is, therefore, a primary object of the present invention to provide an economical and simplified method for manufacturing an array of actuators having a novel structure wherein each of the actuators comprises a signal electrode, a pair of reference electrodes, and two layers of an electrodisplacive material between the signal and the pair of reference electrodes.

In accordance with one aspect of the present invention, there is provided a novel method for manufacturing an array of M×N electrodisplacive actuators, wherein M and N are integers, for use in an optical projection system, said method comprising the steps of:

(a) forming a multilayered ceramic structure having M layers of a first conductive metallization and M+1 layers of an electrodisplacive material, wherein each layer of the first conductive metallization is placed between two layers of the electrodisplacive material;

(b) slicing said multilayered ceramic structure in a direction normal to the layers of the first conductive metallization resulting in a composite ceramic wafer having a flat surface, wherein the electrodisplacive material is evenly separated in a horizontal direction by said M layers of the first conductive metallization;

(c) providing on the entirety of said flat surface of said composite ceramic wafer M+1 regularly spaced horizontally directional trenches wherein each of said trenches has a pair of side surfaces and a bottom surface, runs parallel to each other, is located at an equidistance from two adjacent layers of the first conductive metallization and is separated from each other by a barrier having a top surface;

(d) constructing a composite ceramic body by forming a second conductive metallization on said side and bottom surfaces of each of said trenches; and (e) preparing N−1 regularly spaced vertically directional cuts on said composite ceramic body to thereby obtain the array of M×N electrodisplacive actuators.

In accordance with another aspect of the present invention, there is provided an array of M×N actuators wherein each of the M×N actuators comprises a pair of layers of an electrodisplacive material, a layer of a first conductive metallization located between the pair of layers of the electrodisplacive material, and a pair of layers of a second conductive metallization on the external sides, respectively, of said pair of layers of the electrodisplacive material. In the actuator array, the first and the second conductive metallization layers function as the signal and the reference electrodes, respectively.

BRIEF DESCRIPTION OF THE DRAWINGS

The above and other objects, and features of the present invention will become apparent from the following description of preferred embodiments given in conjunction with the accompanying drawings, wherein.

DETAILED DESCRIPTION OF THE PREFERRED EMBODIMENTS

Figure 1A:
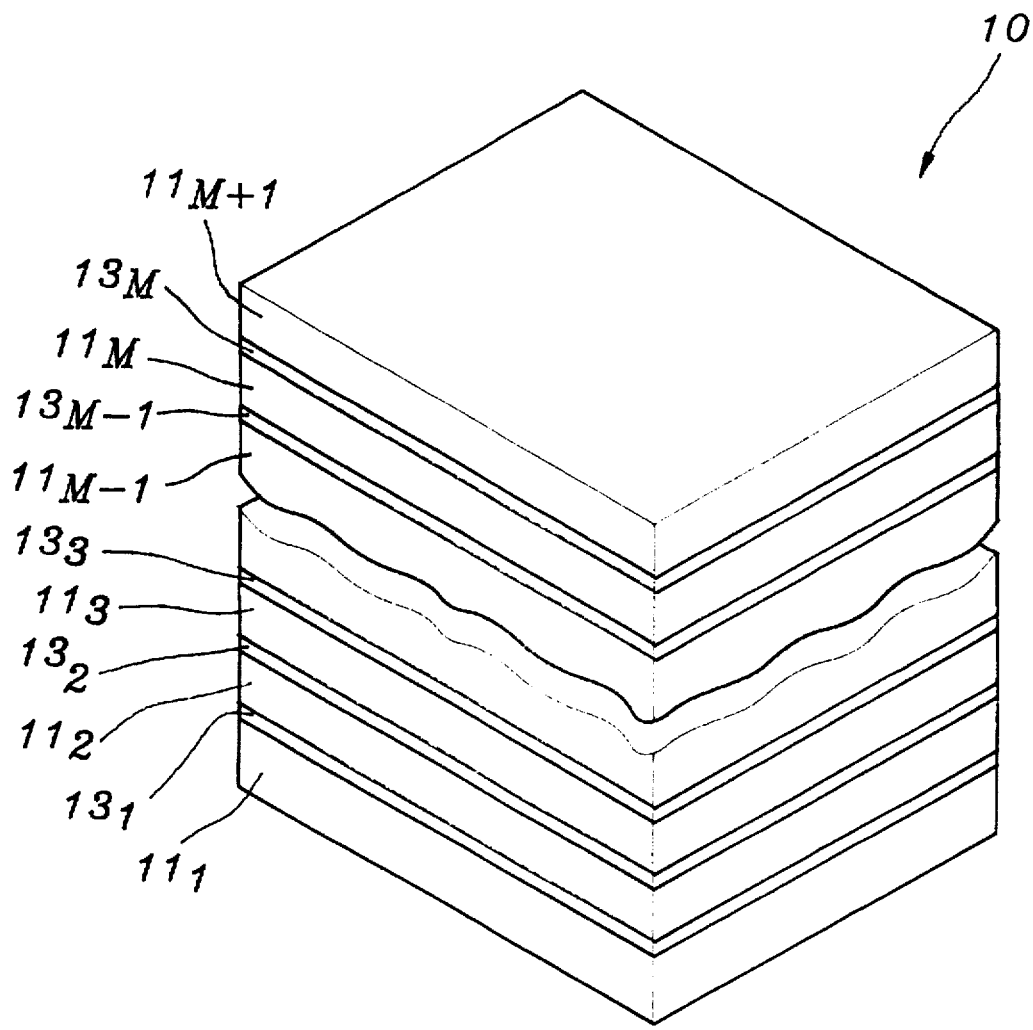
FIGS. 1A to 1I illustrate the steps used in constructing an array of M×N electrodisplacive actuators in accordance with the present invention.

In accordance with the present invention, the method for manufacturing the inventive array of M×N electrodisplacive actuators begins with the preparation of a multilayered ceramic structure 10, having M layers of a first conductive metallization $13_M$ and M+1 layers $11_{M+1}$ of an electrodisplacive material, e.g., lead magnesium niobate, wherein each layer of the first conductive metallization $13_M$ is placed between two layers of the electrodisplacive material as shown in FIG. 1A. The layers of the first conduction metallization $13_M$ are comprised of platinum(Pt), or palladium(Pd) or palladium/silver(Pd/Ag). The multilayered ceramic structure shown in FIG. 1A can be obtained by utilizing a conventional method well known in the art for manufacturing multilayered ceramic capacitors. In the case of an array of piezoelectric actuators, there is an additional constraint: that is, the multilayered structure 10 must be poled before proceeding to a next step, by applying an electric field in a direction normal to the plane of the layers of the first conductive metallization $13_M$.

Figure 1B:
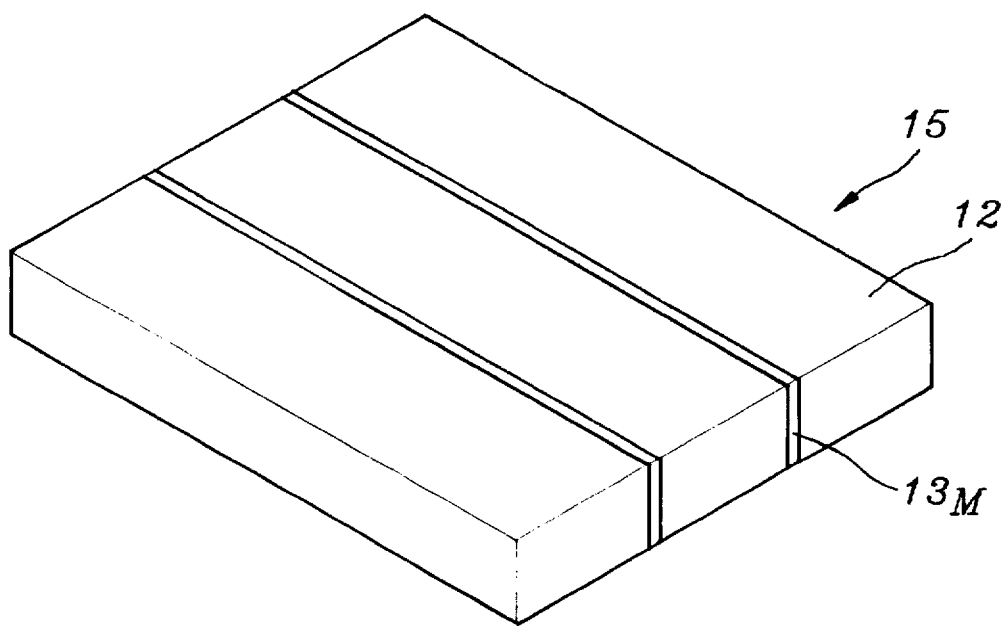

Thereafter, as shown in FIG. 1B, by slicing the multilayered structure 10 in a direction normal to the layers of the first conductive metallization $13_M$, there is formed a composite ceramic wafer 15 having a flat surface 12, wherein the electrodisplacive material is evenly separated by M layers of the first metallization $13_M$.

Figure 1C:
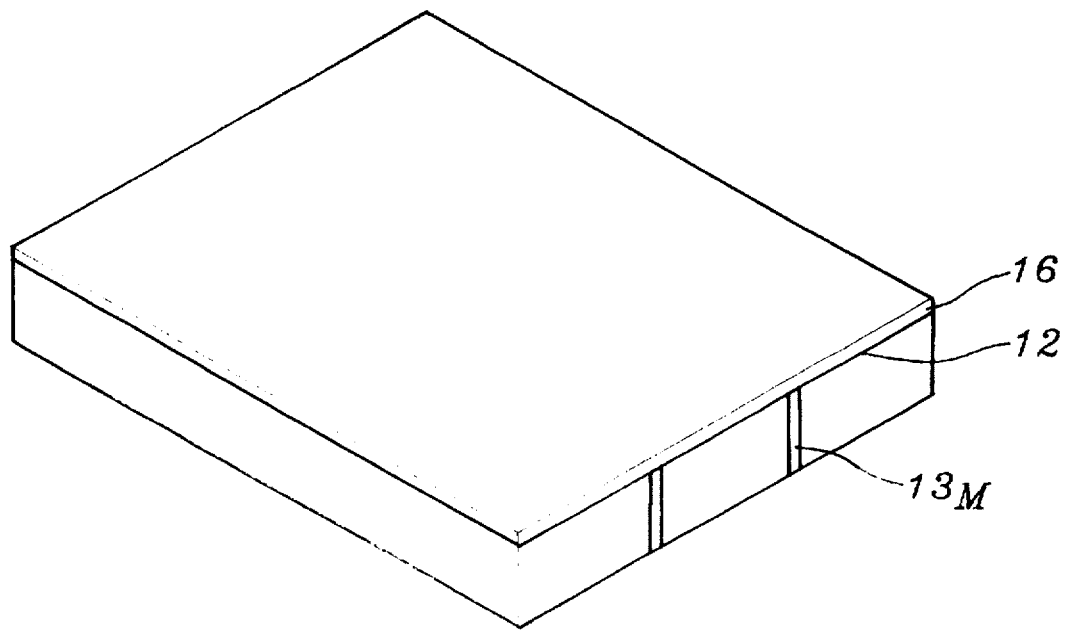

In the subsequent step, the flat surface 12 is covered with a thin layer 16 of a polymer such as photoresist as shown in FIG. 1C.

Figure 1D:
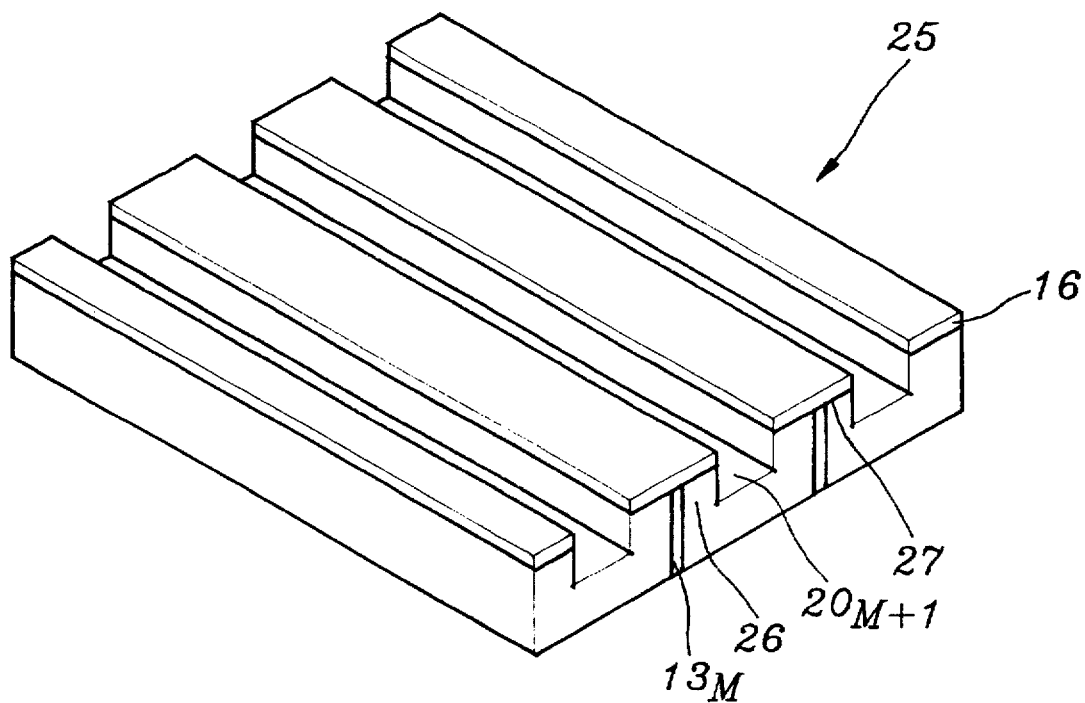
Figure 1E:
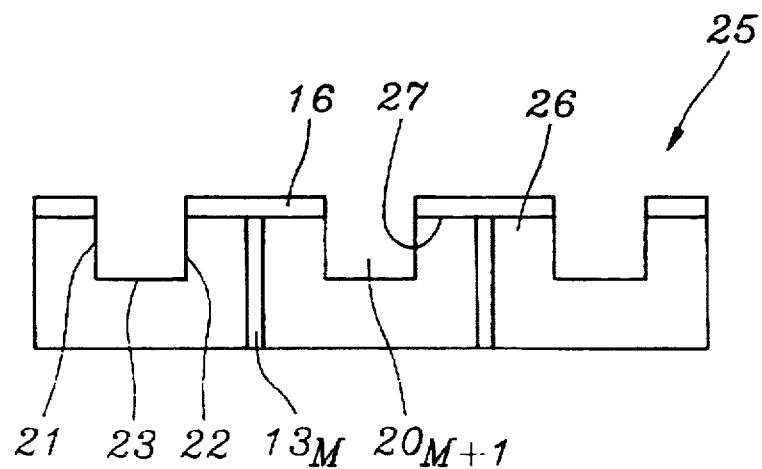

Thereafter, as shown in FIGS. 1D and 1E, there are formed, on the entire flat surface 12 covered with the thin polymeric layer 16, M+1 regularly spaced horizontally directional trenches $20_{M+1}$ of an identical size, having substantially square edges, running parallel to each other, wherein each of the trenches $20_{M+1}$ has two side surfaces 21, 22, and a bottom surface 23, resulting in a trenched ceramic wafer 25. Furthermore, each of the trenches $20_{M+1}$ is located at an equidistance from two adjacent layers of the first conductive metallization $13_M$ and is separated by a barrier 26 having its top surface 27 covered with the thin polymeric layer 16. FIG. 1D represents the perspective view of the trenched ceramic wafer 25; and FIG. 1E, the cross-sectional view thereof.

Figure 1F:
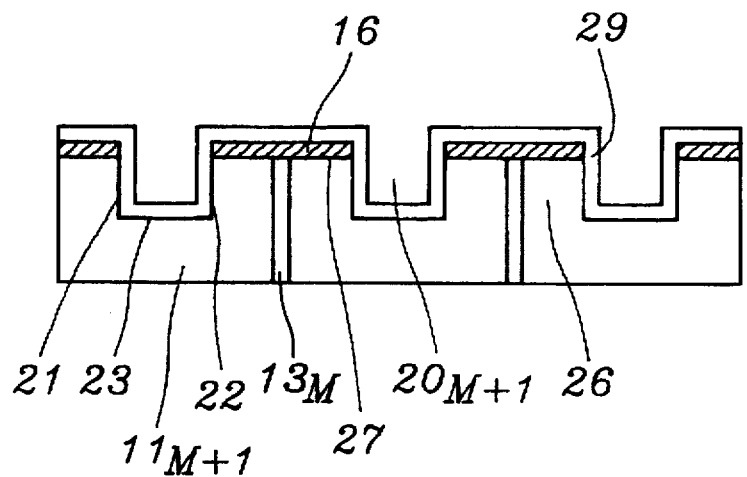
Figure 1G:
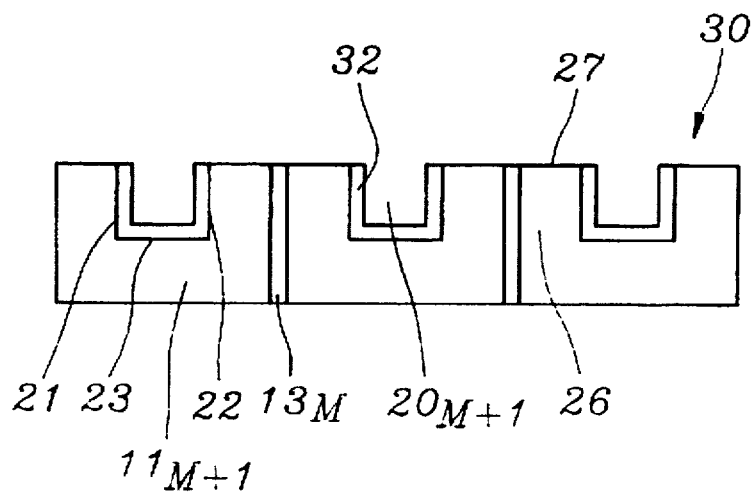
Figure 1H:
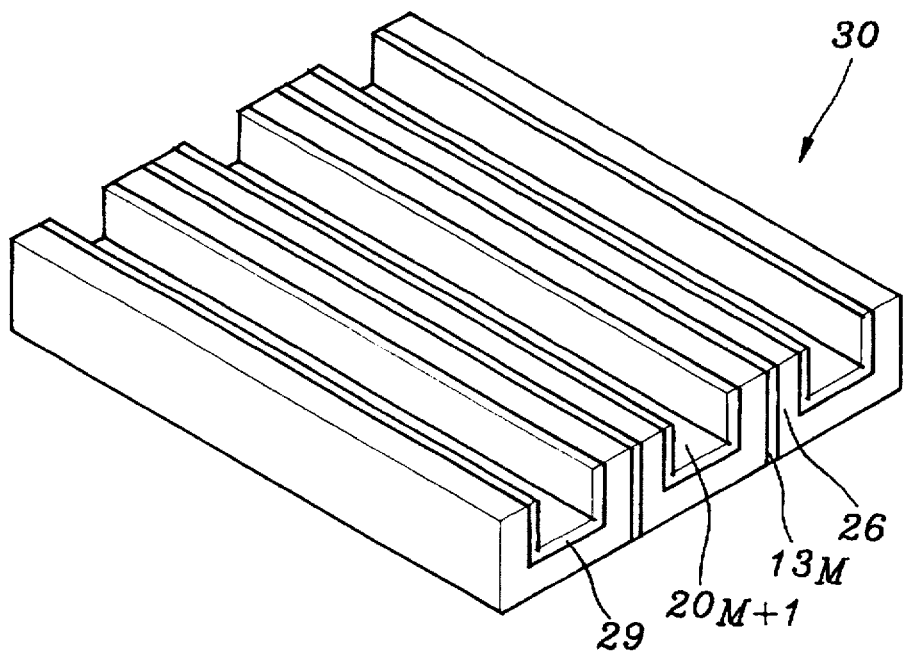

As shown in FIGS. 1G and 1H, a second conductive metallization 32, comprising either silver (Ag) or aluminum (Al), is formed on the side surfaces 21, 22 and the bottom surface 23 of the trenches $20_{M+1}$, by first depositing a metallic layer 29, comprising either silver(Ag) or aluminum (Al), on the entire top surface of the shaped ceramic wafer 25 including the thin polymeric layer 16 on the top surface 27 of the barriers 26, the side surfaces 21, 22 and the bottom surface 23 of the trenches $20_{M+1}$ as shown in FIG. 1F, and then removing the metallic layer 29 formed on the thin polymeric layer 16 by dissolving the latter using an appropriate solvent, e.g., acetone, resulting in a ceramic body 30. FIG. 1F illustrates the cross sectional view of the shaped ceramic wafer 25 after the top surface thereof has been covered with the second metallic layer 29; FIG. 1G represents the cross sectional view of the ceramic body 30; and FIG. 1H, the perspective view thereof.

The metallic layer 29 is obtained by using such a conventional technique as sputtering or thermal evaporation.

Figure 1I:
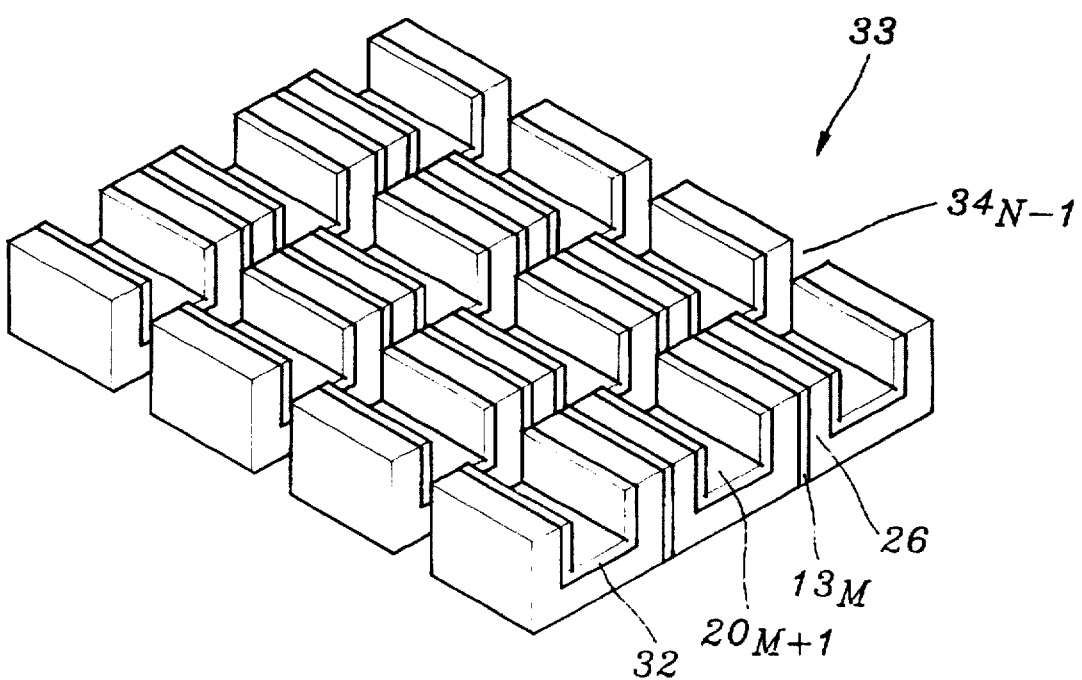

In the subsequent step, there are made, on the ceramic body 30, N−1 regularly spaced vertically directional cuts $34_{N-1}$, resulting in an array of M×N electrodisplacive actuators 33 as shown in FIG. 1I.

The array of electrodisplacive actuators 33 is then mounted on a substrate such that the first and the second conductive metallizations $13_M$, 32 function as the signal and the reference electrodes, respectively; and, therefore, the first conductive metallization $13_M$, is connected to a driver and the second conductive metallization 32 is interconnected to a common ground potential (not shown).

When a voltage is applied between the first and the second conductive metallizations $13_M$ and 32, the electrodisplacive material located between them will deform in a direction determined by the polarity of the voltage.

In order for the array 33 shown in FIG. 1I to be used as an actuated mirror array in an optical projection system, said mirrors must be attached together.

In this connection, there is disclosed a method for attaching the mirrors on such an array of actuators in a copending, commonly owned application, U.S. Ser. No. 08/216,755, entitled "MIRROR ARRAY AND METHOD FOR MANUFACTURE THEREOF", which is incorporated herein by reference.

While the present invention has been shown and described with reference to the particular embodiments, it will be apparent to those skilled in the art that many changes and modifications may be made without departing from the spirit and scope of the invention as defined in the appended claims.

What is claimed is:

1. An array of M×N actuators for use in an optical projection system wherein each of the actuators consists of:
   a pair of layers of an electrodisplacive material;
   a layer of a first conductive metallization located between said pair of layers of the electrodisplacive material, wherein said layer of the first conductive metallization is comprised of one of platinum, palladium and palladium/silver; and
   a layer of a second conductive metallization on either side of the pair of layers of the electrodisplacive material.

2. The array of actuators of claim 1, wherein the second conductive metallization is comprised of aluminum.

* * * * *

UNITED STATES PATENT AND TRADEMARK OFFICE
CERTIFICATE OF CORRECTION

PATENT NO. : 5,768,008
DATED : June 16, 1998
INVENTOR(S) : Yong-Bae Jeon

It is certified that error appears in the above-identified patent and that said Letters Patent is hereby corrected as shown below:

Title page, item

[30] Foreign Application Priority Data should read --

Mar. 23, 1993  [KR]  Rep. of Korea  93-4503

Signed and Sealed this

Twentieth Day of October, 1998

Attest:

BRUCE LEHMAN

*Attesting Officer*  *Commissioner of Patents and Trademarks*